(12) United States Patent
Song et al.

(10) Patent No.: US 12,191,868 B2
(45) Date of Patent: Jan. 7, 2025

(54) FREQUENCY-LOCKED AND PHASE-LOCKED LOOP-BASED CLOCK GLITCH DETECTION FOR SECURITY

(71) Applicant: NVIDIA Corporation, Santa Clara, CA (US)

(72) Inventors: Sanquan Song, Los Altos, CA (US); Stephen G. Tell, Chapel Hill, NC (US); Nikola Nedovic, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 18/595,042

(22) Filed: Mar. 4, 2024

(65) Prior Publication Data
US 2024/0204785 A1    Jun. 20, 2024

Related U.S. Application Data

(63) Continuation of application No. 18/106,398, filed on Feb. 6, 2023, now Pat. No. 11,962,312.

(60) Provisional application No. 63/345,534, filed on May 25, 2022.

(51) Int. Cl.
*H03L 7/099* (2006.01)
*H03L 7/089* (2006.01)

(52) U.S. Cl.
CPC ............ *H03L 7/099* (2013.01); *H03L 7/0891* (2013.01)

(58) Field of Classification Search
CPC .................... H03L 7/099; H03L 7/0891
See application file for complete search history.

(56) References Cited

U.S. PATENT DOCUMENTS

| | | | | |
|---|---|---|---|---|
| 4,394,776 A * | 7/1983 | Borras | ................... | H03J 5/0281 455/76 |
| 4,403,342 A * | 9/1983 | Borras | ................... | H03J 5/0281 455/76 |
| 4,472,820 A * | 9/1984 | Borras | ................... | H04B 1/405 377/110 |
| 4,490,688 A * | 12/1984 | Borras | ................... | H03L 7/0802 327/8 |
| 11,315,196 B1 * | 4/2022 | Narayan | ............. | G06F 18/2193 |
| 2012/0242384 A1 * | 9/2012 | Kato | ...................... | H03L 7/1974 327/157 |

(Continued)

FOREIGN PATENT DOCUMENTS

CN    104935253 B  *  7/2018

OTHER PUBLICATIONS

Luo P., et al., "System Clock and Power Supply Cross-Checking for Glitch Detection," Cryptology ePrint Archive, Department of Electrical and Computer Engineering, 2016, pp. 1-8.

(Continued)

*Primary Examiner* — Adam D Houston
(74) *Attorney, Agent, or Firm* — Lowenstein Sandler LLP

(57) ABSTRACT

A glitch detection device includes an oscillator to generate multiple local clocks of multiple different phases and a sampling circuit to oversample, using the multiple local clocks, a system clock to generate multiple samples of the system clock. The device further includes a glitch detector to monitor a variation in pulse width of the system clock based on counting the multiple samples and to report a glitch in response to detecting a variation in the pulse width that exceeds a threshold value.

23 Claims, 10 Drawing Sheets

(56) References Cited

U.S. PATENT DOCUMENTS

| | | | | |
|---|---|---|---|---|
| 2015/0171890 A1* | 6/2015 | Pagnanelli | ............ | H03M 3/468 |
| | | | | 341/143 |
| 2015/0263759 A1* | 9/2015 | Marienborg | .......... | H03M 3/424 |
| | | | | 341/143 |
| 2016/0352504 A1* | 12/2016 | Gu | .......................... | H03L 7/081 |
| 2016/0380759 A1* | 12/2016 | Kondo | .................... | H03L 7/091 |
| | | | | 375/376 |
| 2021/0064789 A1* | 3/2021 | Vincent | ................ | G06F 21/755 |
| 2023/0318608 A1* | 10/2023 | Uehara | .................... | H03K 5/26 |
| | | | | 327/291 |
| 2023/0387922 A1* | 11/2023 | Song | ........................ | H03L 7/093 |
| 2023/0403017 A1* | 12/2023 | Zanchi | .................... | H03L 7/085 |

OTHER PUBLICATIONS

Nagata M., et al., "On-Chip Attack Protection Circuits for Hardware Security," IEEE Custom Integrated Circuits Conference, Apr. 14, 2019, pp. 1-6.

Verbauwhede I., et al., "24.1 Circuit Challenges from Cryptography," IEEE International Solid-State Circuits Conference Digest of Technical Papers, Feb. 22, 2015, pp. 428-429.

* cited by examiner

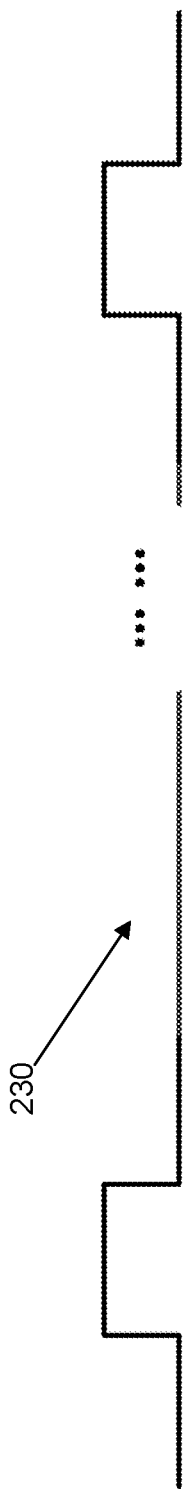
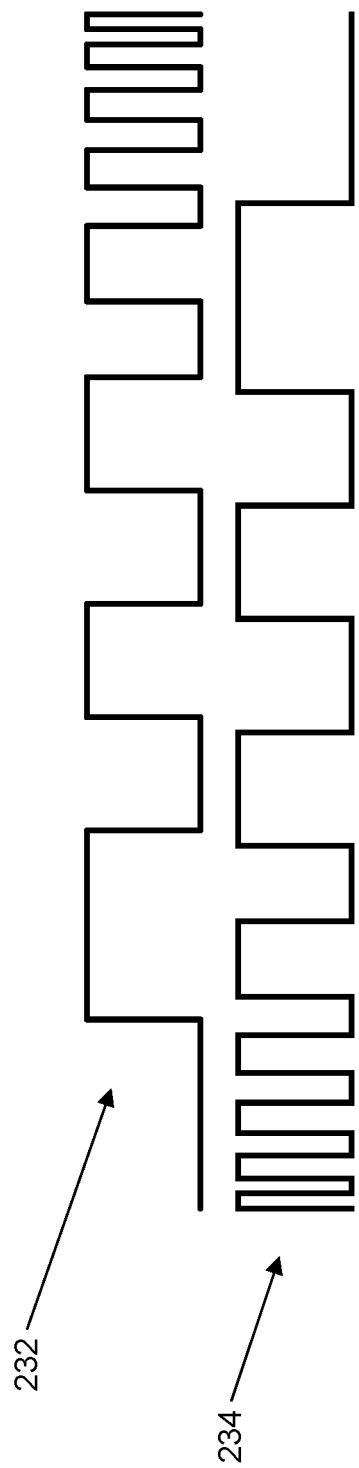

FREQUENCY-LOCKED AND PHASE-LOCKED LOOP-BASED CLOCK GLITCH DETECTION FOR SECURITY

REFERENCE TO RELATED APPLICATION

This application is a continuation of U.S. patent application Ser. No. 18/106,398, filed Feb. 6, 2023, which claims the benefit of U.S. Provisional Patent Application No. 63/345,534, filed May 25, 2022, the entirety of which is incorporated herein by reference.

TECHNICAL FIELD

At least one embodiment generally pertains to computer systems, and more specifically, but not exclusively, to a frequency-locked loop (FLL)-based or a phase-locked (PLL)-based clock glitch detection for security.

BACKGROUND

The rapid complexity growth of contemporary electronic systems increases their vulnerability to hacking. These electronic systems (e.g., data center devices, Internet-of-things (IoT) devices, and personal devices, among others) may include one or more integrated circuit (IC) chip(s) that have on-die circuits being run off of a system clock provided by a larger system within which the IC chip(s) are integrated. For example, some ICs are considered a system on a chip (SoC) or the like that perform a specialized role within the larger system, including that of security, cryptography, and the like.

These circuits, however, may be located on a separate die and each either uses the system clock or generates a local clock that is directly derived from the off-chip (or off-die) system clock. As an effective approach, hackers endeavor to manipulate the off-chip system clock to trigger timing errors for getting access to protected system data. One such manipulation is to cause a fault injection, for example, by causing glitches to be inserted into the system clock that may flip internal state(s) of the IC chip. If these bits, by way of example, are employed to enable encryption, then causing the bits to be flipped can make the system transparently accessible by the hacker, who may then retrieve, alter, or erase internal data of the system.

BRIEF DESCRIPTION OF DRAWINGS

Various embodiments in accordance with the present disclosure will be described with reference to the drawings, in which:

FIG. 2C is a graph that illustrates a clock stop attack, in accordance with at least one embodiment;

FIG. 2D is a set of graphs that illustrate a clock ramp type of clock attack, in accordance with at least some embodiments;

DETAILED DESCRIPTION

Figure 1A:
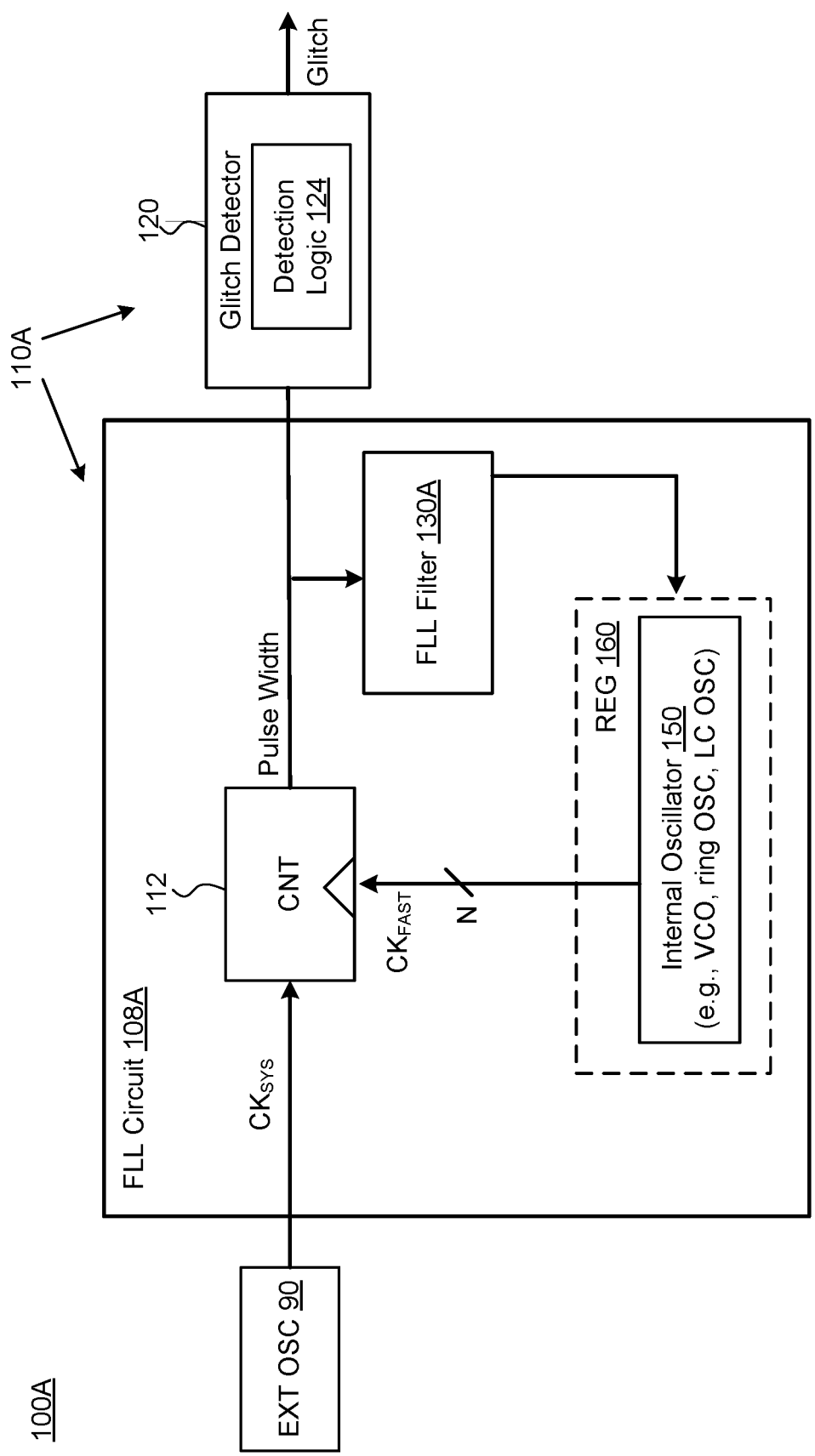
FIG. 1A is a schematic block diagram of an example computing system having an example on-die glitch detection device, in accordance with at least some embodiments.

Aspects and embodiments of the present disclosure address the above security issues that are exposed when a separate die or IC (such as a security chip) relies on a system clock that is off-chip of the die. For example, a hacker may alter a clock width, insert an additional smaller clock pulse, change a frequency of the clock, or the like, in order to attempt causing state bits to be flipped on the IC or die. For security purposes, an on-chip, high-speed clock may be employed to precisely monitor the system clock to catch irregularities in the form of glitches. As an example, an on-die, free-running voltage-controlled oscillator (VCO) is vulnerable to supply fault injection and has a wide frequency spread over process, voltage, temperature (PVT) variations, creating an additional burden to follow-on processing unit(s) and sensitivity variation. Other types of oscillators are also similarly vulnerable.

To address this security risk, e.g., as a countermeasure to fault injection into the system clock that is used by the die, a frequency-locked loop (FLL)-based (or phase-locked loop (PLL)-based) clock glitch detection device (or circuit) may be employed on-die of the IC. This FLL- or PLL-based glitch detection device may be designed with a higher-speed clock that oversamples the system clock, but by locking onto a large multiple (e.g., 16-64×) of the frequency of the system clock. By doing so, the glitch detection device may detect glitches or pulse width variations potentially down to around three percent of the input clock cycle of the system clock, even with a low supply voltage.

In at least some embodiments, the glitch detection circuit or device on the IC chip or die includes an oscillator to generate multiple local clocks of multiple different phases. A supply regulator may convert a chip supply voltage (such as an analog or a digital supply voltage on the IC chip or die) to an oscillator supply voltage, which drives the phases of the multiple local clocks. In some embodiments, the multiple clocks and multiple phases are four in number, although other numbers of phases are envisioned. A sampling circuit may be used to oversample, using the multiple local clocks, a system clock to generate multiple samples of the system clock. Additional analog circuitry may also be employed to fine-tune generation, by the oscillator, of the multiple different phases and to reduce sensitivity to the PVT-based variations.

In these embodiments, digital logic, which may be powered by the chip supply voltage, includes a glitch detector to monitor a variation in pulse width of the system clock based on counting the multiple samples. The glitch detector may further report a glitch in response to detecting a variation in the pulse width that exceeds a threshold value, e.g., by pattern matching the pulse widths with an expected pulse pattern. In these embodiments, a FLL filter may be coupled between the glitch detector and the oscillator. The FLL filter may be adapted to variably adjust the oscillator based on a frequency of each of the multiple samples to control an output frequency of each of the multiple different phases of the oscillator. In cases of using a voltage regulator that controls a VCO or other ring oscillator, for example, the FLL filter may variably adjust the oscillator supply voltage based on a frequency of each of the multiple samples to control the output frequency of each of the multiple different phases.

Therefore, advantages of the devices, systems, and methods implemented in accordance with some embodiments of the present disclosure include, but are not limited to, the ability for an on-chip glitch detector to securely detect glitches within the system clock with high accuracy, without a corresponding vulnerability to supply voltage injection, without high current consumption, and without sensitivity to PVT corners, as described in detail herein. Other advantages will be apparent to those skilled in the art of security circuits, FLL-based or PLL-based internal clock control, and specialized integrated circuit design discussed hereinafter.

FIG. 1A is a schematic block diagram of an example computing system 100A having an example on-die glitch detection device 110A (or circuit), in accordance with at least some embodiments. The glitch detection device 110A, which is located on-die of an SoC or integrated circuit (IC) chip, may include processing circuitry driven based on a system clock ($CK_{SYS}$) received from an external oscillator 90 that is located off-die within the computing system 100A. In at least some embodiments, the glitch detection device 110A includes, but is not limited to an FLL circuit 108A and a glitch detector 120. For example, the FLL circuit 108A may be coupled between the external oscillator 90 and the glitch detector 120. While the glitch detection device 110A is referred to, the components and functionality of the glitch detection device 110A may be understood to be present on an IC or die that performs one or more specific functions, such as security, cryptography, and/or other such functions as previously discussed. Further, such an IC or die may also be a graphics processing unit (GPU), a central processing unit (CPU), a data processing unit (DPU), or other programmed processor or application-specific integrated circuit (ASIC), listed only by way of example.

Figure 2A:
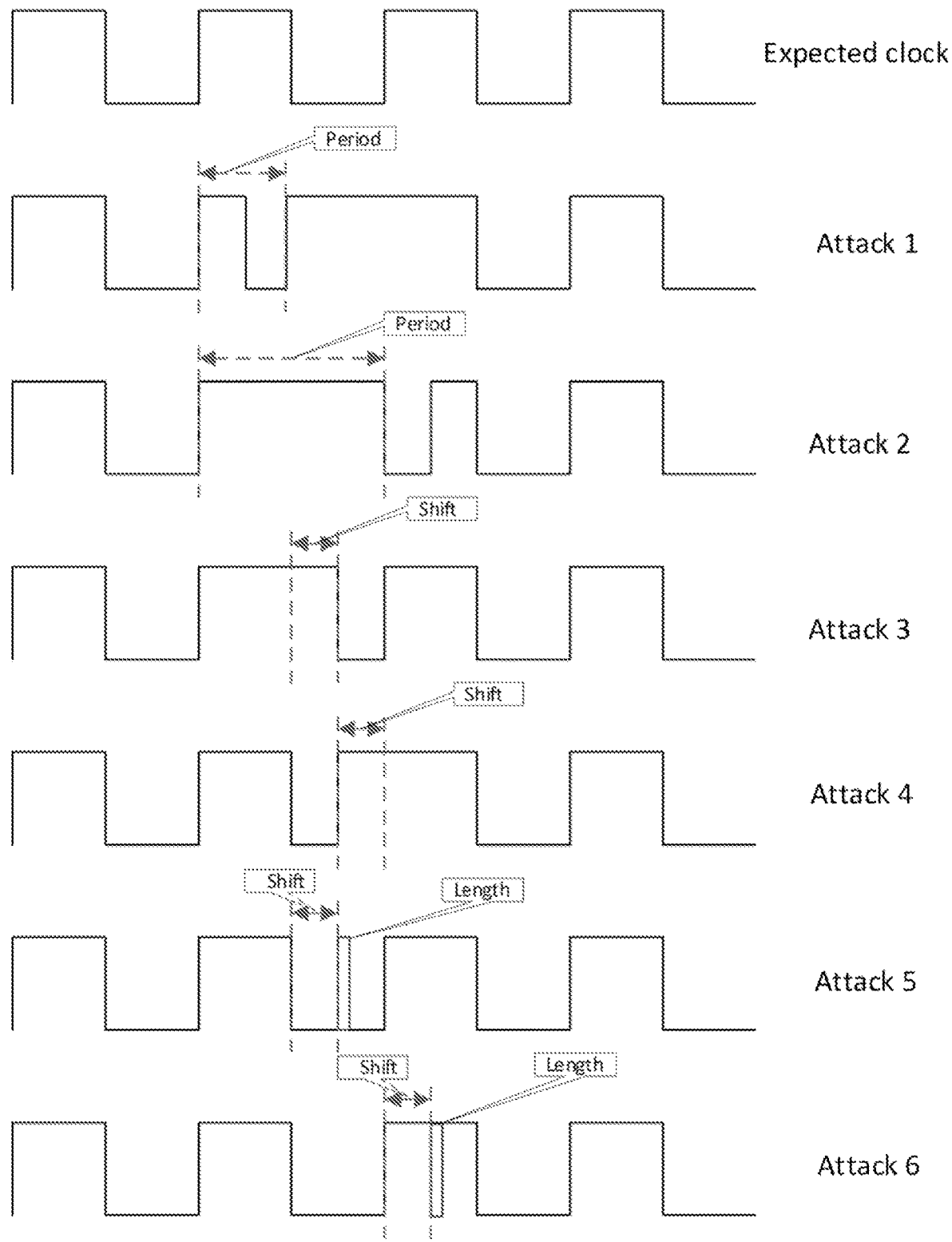
FIG. 2A is a set of graphs that illustrate a number of potential clock-based attacks, in accordance with at least some embodiments.

Before describing the glitch detection device 110A in more detail, a number of examples of possible system clock-based attacks are described, all of which may be detected by detection logic 124 of the glitch detector 120. FIG. 2A is a set of graphs that illustrate a number of potential clock-based attacks, in accordance with at least some embodiments. The top graph illustrates an expected clock for comparison purposes to the attack waveforms illustrated below the top graph. A first attack (Attack 1) may involve shortening a period of the system clock. A second attack (Attack 2) may involve lengthening a period of the system clock. A third attack (Attack 3) may involve shifting to increase a back half of a pulse width of the system clock. A fourth attack (Attack 4) may involve shifting to increase a front half of a pulse width of the system clock. A fifth attack (Attack 5) may involve the insertion of a short positive pulse during a negative clock pulse of the system clock. A sixth attack (Attack 6) may involve the insertion of a short negative pulse during a positive pulse of the system clock. The clock attacks of FIG. 2A generally, therefore, deal with variation of the period or pulse width of the system clock or the insertion of shorter pulses that glitch opposite to a current clock pulse.

Figure 2B:
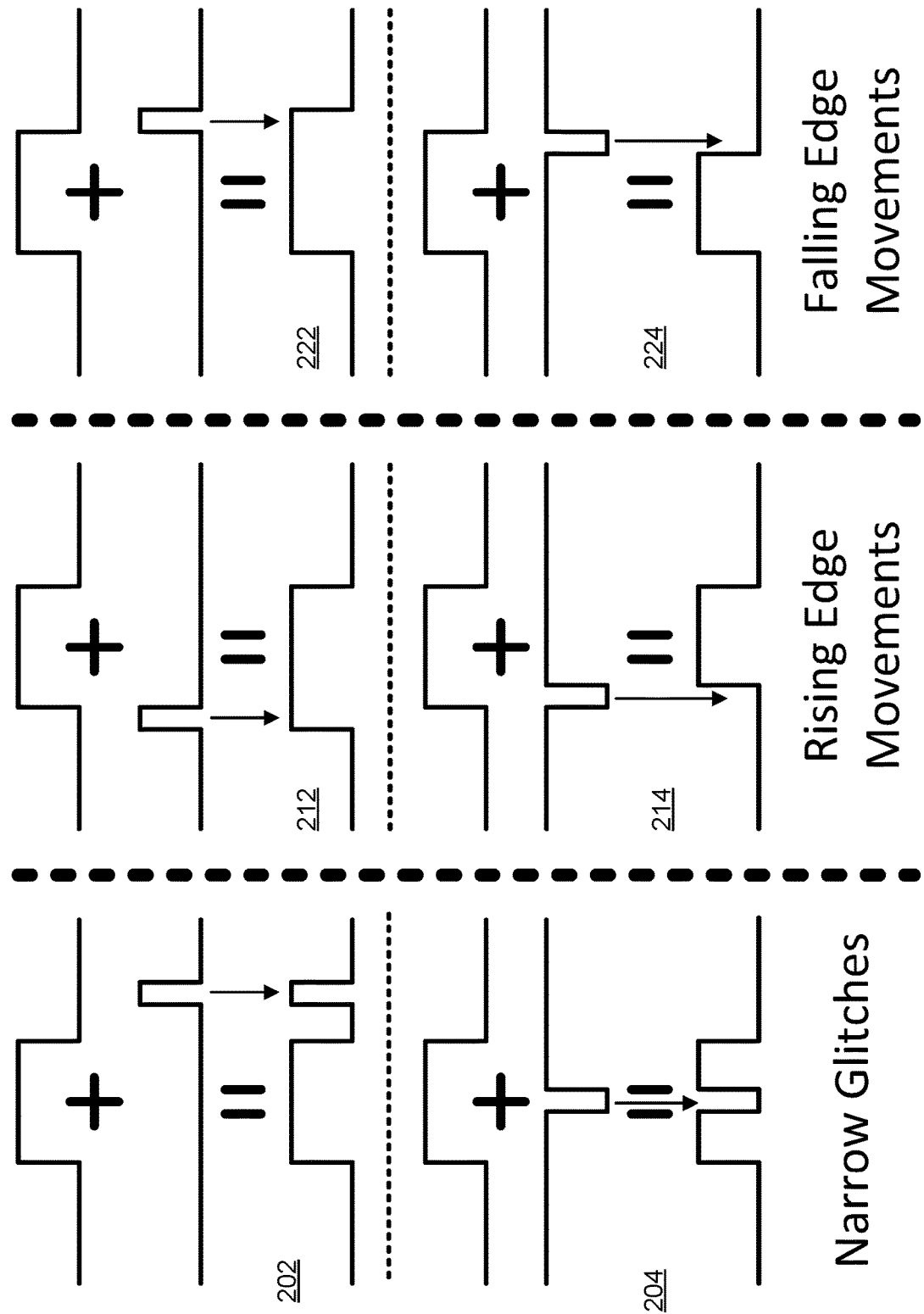
FIG. 2B are multiple sets of graphs that illustrate a number of pulse insertion types of clock attacks, in accordance with at least some embodiments.

FIG. 2B are multiple sets of graphs that illustrate a number of pulse insertion types of clock attacks, in accordance with at least some embodiments. For example, these graphs may be variations of the fifth attack and the sixth attack, as these were discussed with reference to FIG. 2A. In narrow glitch insertions, with reference to a first set of graphs 202, a narrow glitch is added after a previous clock pulse. In a second set of graphs 204, a narrow glitch is added to cause a transition within the middle of the clock pulse.

In rising edge movement, with reference to a third set of graphs 212, a positive glitch is inserted to a rising edge of a clock pulse to cause the pulse width of the clock pulse to be widened. In a fourth set of graphs 214, a negative glitch is inserted to a rising edge of the clock pulse to cause the pulse width of the clock pulse to be narrowed.

In falling edge movements, with reference to a fifth set of graphs 222, a positive clock glitch is inserted to a falling edge of a clock pulse to cause the pulse width of the clock pulse to widened. In a sixth set of graphs 224, a negative pulse glitch is added to the falling edge of the clock pulse to cause the clock pulse to be narrowed.

FIG. 2C is a graph that illustrates a clock stop attack, in accordance with at least one embodiment. As illustrated, a pulse 230 has been removed and the system clock thus has been stopped for at least a particular period of time. FIG. 2D is a set of graphs that illustrate a clock ramp type of clock attack, in accordance with at least some embodiments. For example, a first waveform 232 illustrates the clock being ramped slowly from a lower frequency to a higher frequency, while a second waveform 234 is being ramped slowly from a high frequency to low frequency, with corresponding gradual changes in pulse width. In some embodiments, any of the above-discussed clock-based attacks are mixed with other attacks, such as voltage attacks on voltage supply levels, logical states, or the like.

With renewed reference to FIG. 1A, in at least some embodiments, the FLL circuit 108A includes, but is not limited to, a set of counters 112, an FLL filter 130A (e.g., a loop filter), an optional supply regulator 160, and an internal oscillator 150, which components are arranged generally in a frequency-locked loop with reference to the system clock ($CK_{SYS}$). In at least one embodiment, the FLL filter 130A is a digital FLL filter. In various embodiments, the glitch detection device 110A is configured to detect any of the attacks referenced in FIGS. 2A-2D, to include optional precise supply voltage control, to detect such attacks or a combination of such attacks.

More specifically, the internal oscillator 150 may be configured to generate a high-frequency clock (such as 16-64 times higher than the system clock), to be able to measure the system clock cycle by cycle while an external (off-die) clock source is used by the glitch detection device 110A. This high-frequency clock may include multiple local clocks of multiple different phases for the set of counters 112 to count in order to precisely determine a pulse width of each clock pulse. The glitch detection device 110A may thus be configured to detect the above-described clock modifications or glitches with high resolution (catching the narrowest possible glitches allowed by the clocking path), high confidence (to avoid false alarms, e.g., be insensitive to allowed droops and overshoots), and employ relatively inexpensive logic so that the detection logic 124 can be built strong against attacks to itself, to include being powered by a core supply voltage (Vdd) that is independently controlled.

In at least some embodiments, the FLL circuit 108A is configured to lock a frequency of the internal oscillator 150 to a multiple of the incoming clock frequency through oversampling the system clock, use the set of counters 112 to count the pulse width of the system clock, and use the FLL filter 130A to filter the measured pulse width to control the internal oscillator 150. Such filtering of the measured pulse width may include detecting a frequency of each of the multiple samples of the local clock, with which to control an output frequency of each of the multiple different phases of the internal oscillator 150. In some embodiments, the set of counters 112, the FLL filter 130A, and the glitch detector 120 are implemented as digital logic, an example of which is illustrated and discussed with reference to FIG. 4A, which can be instantiated on a single chip, for example.

In some embodiments, to reach discussed design specifications, the internal oscillator 150 is an on-die, free-running VCO configured to provide multiple high-frequency clocks at different phases that sampling circuitry is able to use to precisely sample the system clock received from off chip or off die, e.g., from the external oscillator 90. This sampling circuitry, located in front of the set of counters 112 (but not illustrated for simplicity), may thus generate multiple samples of the system clock at different phases. The internal oscillator 150 may be implemented in various ways, as illustrated and discussed with reference to FIGS. 3A-3D.

In these embodiments, the glitch detector 120 is configured to monitor a variation in pulse width of the system clock based on counting of the multiple samples (e.g., using the set of counters 112) and to report a glitch in response to detecting a variation in the pulse width that exceeds a threshold value. Further, in these embodiments, the FLL filter 130A, which is coupled between the glitch detector 120 and the internal oscillator 150, is configured to variably adjust the internal oscillator 150 based on a frequency of the multiple samples to control an output frequency of each of the multiple different phases of the internal oscillator 150.

In at least some embodiments, the FLL circuit 108A includes the optional supply regulator 160 coupled between the FLL filter 130A and the set of counters 112. The supply regulator 160, when employed, converts a chip supply voltage (which can be an analog or digital supply voltage) to an oscillator supply voltage that controls the frequency output of each of the multiple different phases of the multiple local clocks generated by the internal oscillator 150. Thus, in embodiments employing the supply regulator 160, the internal oscillator 150 may be a type of VCO or ring oscillator, where each phase is controlled by a different regulated voltage, thus helping to resolve the PVT variation sensitivity issue as will be further discussed. In embodiments, the set of counters 112 are able to count the multiple samples (generated by the internal oscillator 150) of the system clock to generate a precise measurement of the pulse width of each cycle of the system clock. Multi-phase sampling may allow the internal oscillator 150 to run at a lower rate to get the same resolution, for example.

To avoid using a reference voltage, e.g., that is based on the system clock, for the supply regulator 160, the FLL filter 130A is interposed between the pulse width output (from sampling and crossover circuitry of the set of counters 112) and the supply regulator 160. In these embodiments, the FLL filter 130A locks onto a frequency ratio (e.g., 16×, 24×, or 32×) of the system clock. The FLL filter 130A may compare the speed of the internal oscillator 150 to a target speed, which is the multiple of the system clock, and fine-adjust the oscillator supply voltage so that the high-frequency clocks, which are output from the internal oscillator 150 and used to sample the system clock, stay at a target frequency. More specifically, each tap point of the internal oscillator 150 (e.g., VCO, ring oscillator) will be at a different phase of the target frequency. As the supply regulator 160 (which drives the internal oscillator 150) is controlled by the FLL filter 130A, there is no longer a reference voltage needed for the internal oscillator 150, the internal oscillator 150 has a fixed resolution relative to PVT corners, and it becomes straight-forward for the FLL filter 130A to set timing of target frequencies for the internal oscillator 150.

In various embodiments, the design of the glitch detection device 110A is effective against pulse insertion and clock stops. As to the latter, the internal oscillator 150 is able to generate enough clock edges to overflow the set of counters 112, enabling the glitch detector 120 to detect the attack. Further, the design of the glitch detection device 110A is effective against clock ramps when the FLL filter 130A either locks onto the external oscillator 90 as a frequency multiplier and senses the system clock ($SYS_{CLK}$) or loses frequency lock because of a limited range of frequency operation, thus also enabling attack detection.

Figure 1B:
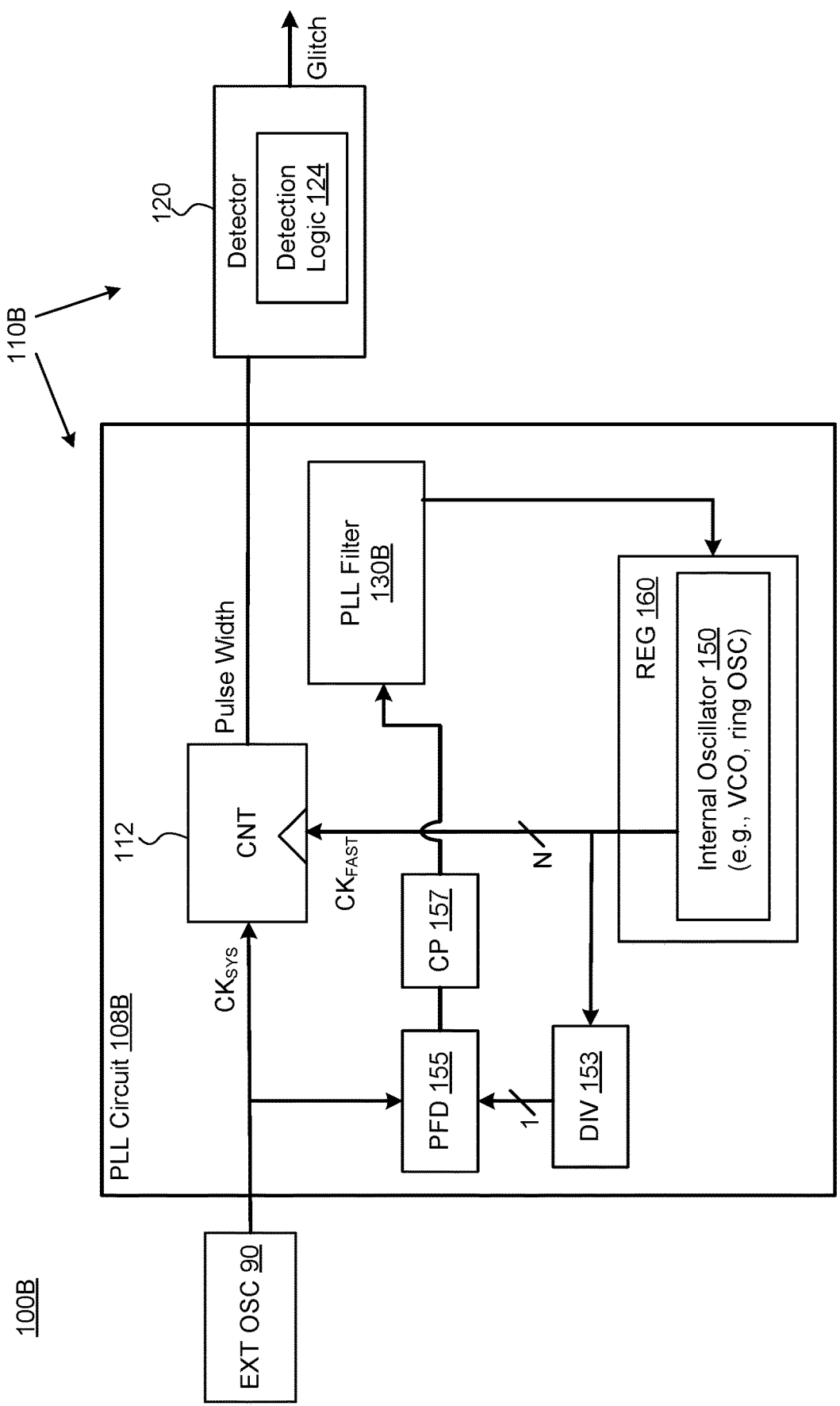
FIG. 1B is a schematic block diagram of an example computing system having an example on-die glitch detection device, in accordance with at least additional embodiments.

FIG. 1B is a schematic block diagram of an example computing system 100B having an example on-die glitch detection device 110B (or circuit), in accordance with at least additional embodiments. The glitch detection device 110B may be understood to be a variation to the glitch detection device 110A of FIG. 1A where a phase-locked loop (PLL) is employed. In these embodiments, the glitch detection device 110B includes a PLL circuit 108B coupled between the external oscillator 90 and the glitch detector 120, where the PLL circuit 108B differs from the FLL circuit 108A in one or more ways.

In at least some embodiments, the PLL circuit 108B includes a PLL filter 130B (e.g., a different kind of loop filter) in lieu of the FLL filter 130A and further includes a feedback divider 153, a phase frequency detector (PFD) 155, and a charge pump 157. As illustrated, the feedback divider 153 may be coupled to an output of the supply regulator 160 going to the set of counters 112 and the PFD 155 may be coupled between the external oscillator 90, the set of counters 112, and the feedback divider 153. The charge pump 157 may be coupled between the PFD 155 and the PLL filter 130B.

In these embodiments, the PFD 155 detects a phase and frequency of the system clock ($CLK_{SYS}$) that is received by the computing system 100B from the external oscillator 90. The PFD 155 may further work to lock onto the phase of the system clock (and thus onto the frequency as well), or generate a digital error pulse for incomplete locking of the phase. The charge pump 157 may convert the digital error pulse to an analog error current that is provided to the PLL filter 130B for adjusting each phase (and thus frequency) of the signal going to the internal oscillator 150. In embodiments, one of the phases output by the internal oscillator 150 may be used by the PFD 155 to lock onto a phase of the input system clock. This phase locking may be understood to be a more stringent requirement than locking onto only the frequency of the system clock (discussed with reference to FIG. 1A).

In at least some embodiments, the feedback divider 153 divides the VCO frequency of the internal oscillator 150 to the PFD input, which allows the PLL circuit 108B (e.g., by way of the PLL filter 130B controlling the internal oscillator 150) to generate the output phases that are locked to the system clock phase. In various embodiments, upon successful locking onto the phase of the system clock, the PLL filter 130B also locks onto a frequency, which is the multiple of the system clock frequency. Thus, the internal oscillator 150 of the PLL circuit 108B is still able to generate a high-frequency clock that includes the multiple local clocks of multiple different phases for the set of counters 112 to count in order to precisely determine a pulse width of each clock pulse.

Figure 3A:
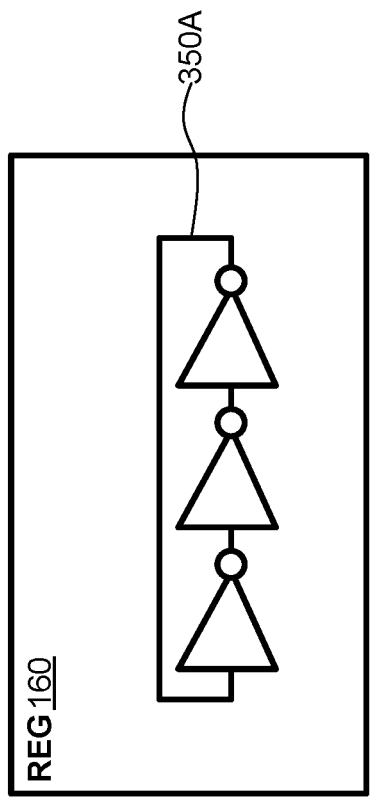
FIG. 3A, FIG. 3B, FIG. 3C, FIG. 3D are schematic diagrams of, respectively, a supply-regulated ring oscillator, a current starving ring oscillator, a digitally-controlled ring oscillator, and an inductive-capacitive (LC) oscillator that are employable as the internal oscillator according to various embodiments.

FIG. 3A, FIG. 3B, FIG. 3C, FIG. 3D are schematic diagrams of, respectively, a supply-regulated ring oscillator 350A, a current starving ring oscillator 350B, a digitally-controlled ring oscillator 350C, and an inductive-capacitive (LC) oscillator 350D, each of which his employable as the internal oscillator 150 (FIGS. 1A-1B) according to various embodiments. With reference to FIG. 3A, the supply-regulated ring oscillator 350A (also referred to as a VCO) may include multiple sets of inverters with different tap points between sets of inverters from which the multiple local clocks are generated.

Figure 3B:
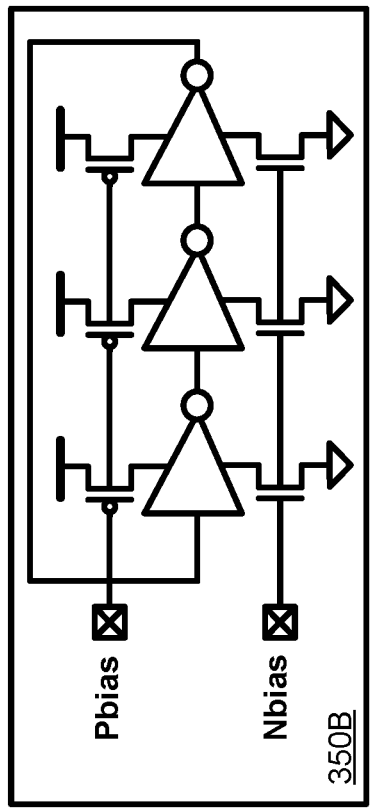

With reference to FIG. 3B, the current starving ring oscillator 350B also includes such multiple sets of inverters, but also employs p-type metal oxide semiconductor (PMOS)-type transistors coupled to positive power terminals of respective inverters and an a p-bias signal to control the PMOS-type transistors. Further, the current starving ring oscillator 350B includes n-type metal oxide semiconductor (NMOS)-type transistors coupled to a negative power terminal of respective inverters and an n-bias signal to control the NMOS-type transistors. The b-bias and n-bias signals can control power to the inventors, and thus whether the multiple sets of inverters are current starved. Similarly with the supply-regulated ring oscillator 350A, tap points between the multiple sets of inverters may provide the multiple local clocks.

Figure 3C:
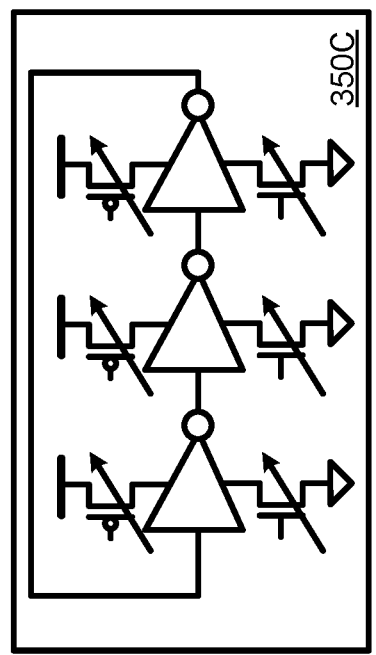

With reference to FIG. 3C, the digitally-controlled ring oscillator 350C has a similar component architecture to that of the current starving ring oscillator 350B. But, in the digitally-controlled ring oscillator 350C, the PMOS-type transistors and the NMOS-type are each variably controlled by digital logic (such as the digital logic 410B of FIG. 4A), providing more granularity in the generation of the multiple local clocks.

Figure 3D:
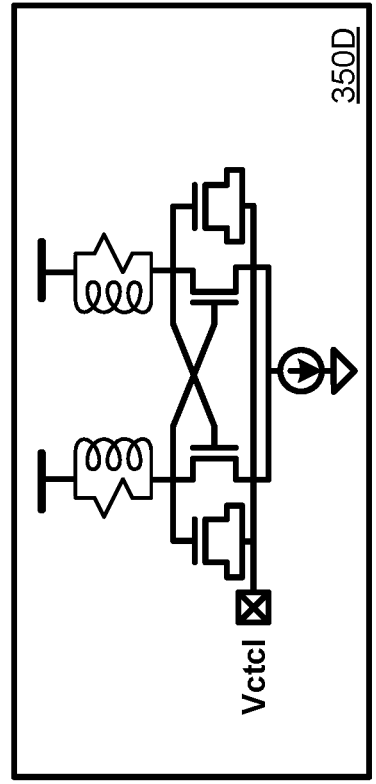

With reference to FIG. 3D, the inductive-capacitive (LC) oscillator 350D includes a parallel set of inductors interconnected with a current mirror, which is controllable via a set of capacitors. A voltage control signal (Vctcl) may control charging of the set of capacitors to control the effective capacitance of the LC oscillator 350D, and thus an output clock. The LC oscillator 350D may convert a DC input (the chip supply voltage) into an AC output (the waveform). This output waveform can have a wide range of different shapes and frequencies, and can be either complex in shape, or be a simple pure sine wave depending upon the application. Multiples of the LC oscillator 350D may be employed in parallel to provide the multiple local clocks discussed herein.

Figure 4A:
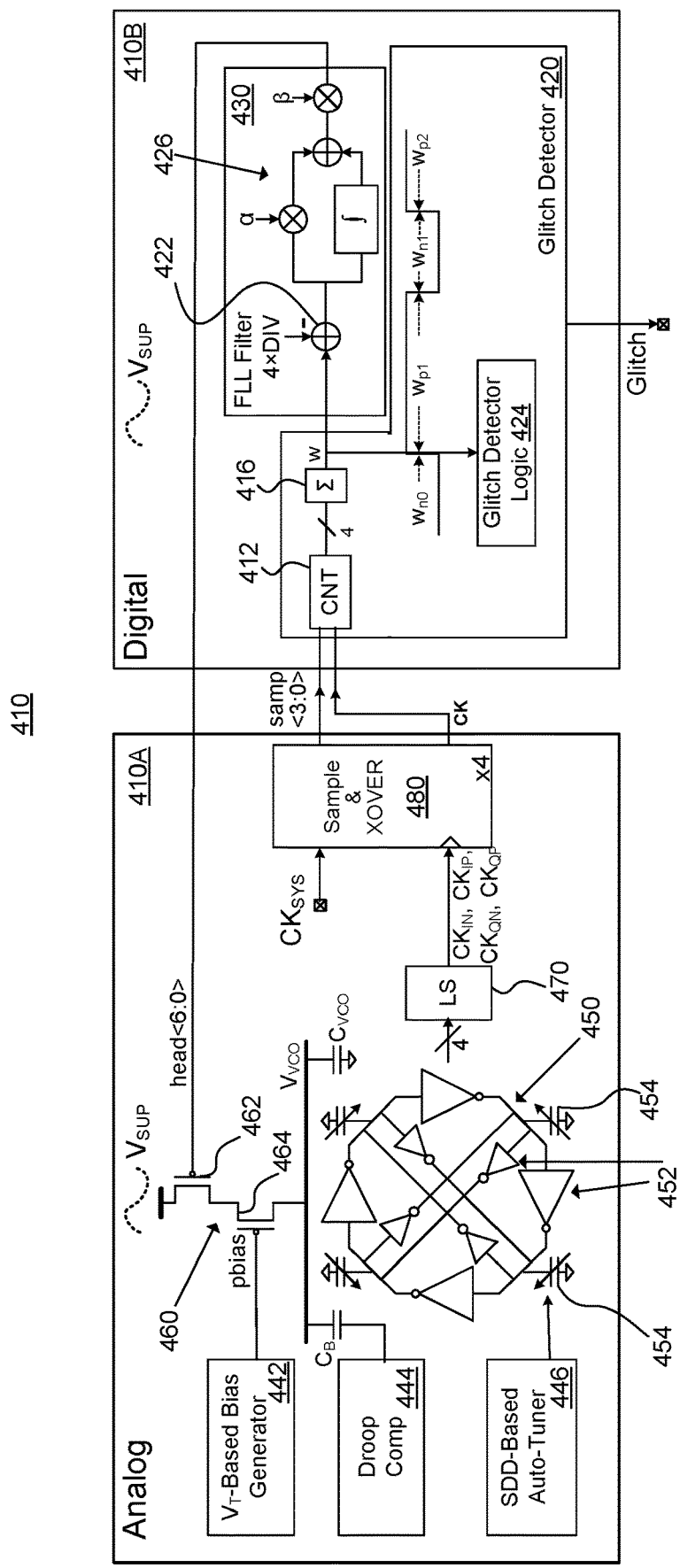
FIG. 4A is a schematic block diagram of an example glitch detection device, with a part-analog and part-digital design, in accordance with at least some embodiments.

FIG. 4A is a schematic block diagram of an example glitch detection device 410, with a part-analog and part-digital design, in accordance with at least some embodiments. In at least some embodiments, the glitch detection device 410 corresponds to the glitch detection device 110 (FIG. 1), and thus, some corresponding numbering is used.

In various embodiments, the glitch detection device 410 is designed with an analog frontend 410A and a digital logic 410B used to measure the pulse width of each clock cycle of the system clock and determine whether a glitch is detected. In these embodiments, the analog frontend 410A includes a VCO 450 having multiple sets of inverters 452 to generate multiple clocks of multiple different phases. In the illustrated embodiment, the multiple sets of inverters 452, the multiple local clocks ($CK_{IN}$, $CK_{IP}$, $CK_{QN}$, $CK_{QP}$), and the multiple different phases are four in number for purposes of explanation, but could be a different integer number. Although the VCO 450 is referenced, any of the oscillators illustrated with reference to FIGS. 3A-3D may also be employed to generate the multiple clocks, and thus reference to the VCO 450 generally makes reference to any of these oscillators.

In these embodiments, the analog frontend 410A further includes a supply regulator 460 to convert a digital supply voltage ($V_{DIG}$) to a VCO supply voltage ($V_{VCO}$). The analog frontend 410A may further include a sampling circuit, which may be a part of a sample and crossover circuit 480, to oversample, using the multiple local clocks, the system clock ($SYS_{CLK}$) to generate multiple samples of the system clock.

In these embodiments, the digital logic 410B includes at least a glitch detector 420 that is configured to monitor a variation in pulse width of the system clock based on counting the multiple samples and to report a glitch in response to detecting a variation in the pulse width that exceeds a threshold value. Further, the digital logic 410B may include a frequency-locked loop (FLL) filter circuit 430 coupled between the glitch detector 420 and the supply regulator 460. In these embodiments, the FLL filter circuit 430 variably adjusts the VCO supply voltage ($V_{VCO}$) based on a frequency of the multiple samples to control an output frequency of each of the multiple different phases of the VCO 450. In some embodiments, the FLL filter circuit 430 includes an FLL filter that functions similarly as explained with reference to the FLL filter 130 (FIG. 1). In other embodiments, the FLL filter circuit 430 instead includes a PLL filter (such as the PLL filter 130B) that enables locking onto a phase of the system clock.

With additional specificity, according to some embodiments, the VCO 450 further includes a VCO capacitor ($C_{VCO}$ or more generally, an oscillator capacitor) coupled to the supply regulator 460. The VCO capacitor may hold the VCO supply voltage ($V_{VCO}$). The VCO capacitor may be a large on-die capacitance is large, e.g., 40-60 picofarads (pF) or the like, that limits hacker accessibility to supply fault injection. In some embodiments, the VCO 450 also includes a multiple-stage ring oscillator, e.g., having four stages with four sets of inverters 452 in the illustrated example. The VCO 450 may further include multiple banks of loading capacitors 454, one bank coupled to each stage of the multiple-stage ring oscillator. Each bank of loading capacitors 454 may include multiple identical capacitors that are individually selectable to enable fine-tuning the amount of additional capacitance added to each stage, enabling fine-tuning of the phase of each respective stage.

In some embodiments, the supply regulator 460 includes multiple first transistors 462 coupled to the digital supply voltage ($V_{DIG}$), where a gates of the multiple first transistors 462 are coupled to an output of the FLL filter circuit 430. The supply regulator 460 may further include a second transistor 464 coupled between the multiple first transistors 462 and the oscillator supply voltage, e.g., a VCO supply voltage ($V_{VCO}$) as illustrated. The multiple first transistors 462 and the second transistor 464 may be p-type metal oxide semiconductor (PMOS) transistors, as illustrated, but in other embodiments are n-type or NMOS transistors. The multiple first transistors 462 may be sized and arranged to decode the digital word from the supply regulator 460 into different values for the VCO supply voltage. This decoding may be from binary, binary coded decimal, one-hot, or other digital representation of a number.

In at least some embodiments, the analog frontend 410A further includes a level shifter 470 coupled to the VCO 450 to translate the multiple local clocks (e.g., $CK_{IN}$, $CK_{IP}$, $CK_{QN}$, $CK_{QP}$) to a logic level of the sampling circuit portion of the sample and crossover circuit 480. A level shifter, also called logic-level shifter or voltage level translator, is a circuit used to translate signals from one logic level or voltage domain to another, allowing compatibility between integrated circuits with different voltage requirements, such as transistor-transistor logic (TTL) and complementary metal oxide semiconductor (CMOS) circuitry. Modern systems use level shifters to bridge domains between processors, logic, sensors, and other circuits. In at least some embodiments, the sample and crossover circuit 480 also includes a crossover circuit coupled between the sampling circuit and multiple counters 412 of the glitch detector 420. The crossover circuit can merge multiple phases of the multiple samples into a single-phase domain and provide a clock of the single-phase domain to the multiple counters 412. The sample and crossover circuit 480 will be discussed in more detail with reference to FIG. 4C.

In various embodiments, three analog circuit techniques are implemented to control the VCO speed (or frequency) spread across PVT corners and limit the false alarms. For example, the analog frontend 410A may include a threshold voltage ($V_T$)-based bias generator 442 coupled to a gate of the second transistor 464, a droop compensation circuit 444 coupled to the VCO supply voltage, and a supply difference detector (SDD)-based auto-tuner 446 coupled to the multiple banks of loading capacitors 454. Each of these components and corresponding techniques will be discussed in more detail with reference to FIG. 4B.

In at least some embodiments, the glitch detector 420 includes the multiple counters 412, one counter to count each of the multiple samples <3:0> received from the sample and crossover circuit 480. The glitch detector 420 may further include a summer 416 to combine values of the multiple counters 412 and generate duty cycle measurements (W) of pulses of the system clock ($CLK_{SYS}$). The glitch detector 420 may further include glitch detector logic 424 to detect the variation in pulse width based on the duty cycle measurements. FIGS. 2A-2D illustrate examples clocks and potential glitches that the glitch detector logic 424 may detect. For example, the glitch detection logic 424 may detect a narrower positive pulse, a narrower negative pulse, a short pulse insertion into a negative pulse, or a short pulse insertion into a positive pulse. The glitch detector logic 424 may detect additional or different glitches (see FIGS. 2A-2D).

In at least some embodiments, the glitch detector logic 424 detects certain combinations of pulse width variations, e.g., with reference to a prior negative pulse width cycle ($W_{n0}$), a first positive pulse width cycle ($W_{p1}$), a first negative pulse width cycle ($W_{n1}$), and a second positive pulse width cycle ($W_{p2}$), which are illustrated in FIG. 4A. Table 1 illustrates a number of possible threshold values that may be detected as a glitch, although other similar pulse width or pulse width combinations are also envisioned in other embodiments.

TABLE 1

| Glitch | Threshold Comparison |
| --- | --- |
| Glitch$_1$ | abs($w_{p1} - w_{n1}$) > threshold$_1$ |
| Glitch$_2$ | abs[($w_{p1} - w_{n1}$) − ($w_{p0} - w_{n0}$)] > threshold$_2$ |
| Glitch$_3$ | abs[($w_{p1} - w_{n1}$) − avg($w_{pk} - w_{nk}$)] > threshold$_3$ |
| Glitch$_4$ | abs($w_{p1} - w_{p0}$) > threshold$_4$, etc |
| Unlock | var($w_{pk} + w_{nk}$) > threshold$_5$ |

With reference to Table 1, Glitch$_1$ may be expressed an absolute value of a difference between a positive cycle duration and an adjacent negative cycle duration of the clock cycle measurements is greater than a first threshold value. Glitch$_2$ may be expressed as an absolute value of a difference between: i) a difference between the positive cycle and the adjacent negative cycle; and ii) a difference between a previous positive cycle and a previous negative cycle of the duty cycle measurements is greater than a second threshold value. Glitch$_3$ may be expressed as an absolute value of a difference between: i) a difference between the positive cycle and the adjacent negative cycle; and ii) an average of a difference between a kth positive cycle and a kth negative cycle of the duty cycle measurements is greater than a third threshold value. Glitch$_4$ may be expressed as an absolute value of a difference between a positive cycle and a previous positive cycle is greater than a fourth threshold value. The "Unlock" glitch may be expressed as a variance of a combination of a kth positive cycle and a kth negative cycle is greater than a fifth threshold. This Unlock glitch can measure a period of the cycle and if that period varies beyond a threshold, the FLL filter circuit 430 has not "locked," and thus detected an unlocked glitch relative to the functionality of the FLL filter circuit 430.

In at least some of these embodiments, the FLL filter circuit 430 is configured to lock onto a frequency that is a multiple of the system clock, as was discussed. In at least some embodiments, the FLL filter circuit 430 includes a subtractor 432 to determine a difference between a measured pulse width of the system clock and a target multiple of the system clock frequency (e.g., 4×DIV), where "DIV" is the FLL feedback divider ratio of the FLL filter circuit 430. The FLL filter circuit 430 may further include a first order digital filter 426 coupled between the subtractor 422 and the supply regulator 460. With the aid of the first order digital filter 426, the FLL filter circuit 430 (or a PLL filter circuit if containing the PLL filter 130B) is able to lock onto the frequency ratio of the system clock, and adjust the VCO supply voltage ($V_{VCO}$) by way of the supply regulator 460 to keep the multiple local clocks (output by the VCO 450) at the target frequency. In this way, the glitch detection device 410 is able to generate independent clock governance without depending directly on the system clock that is subject to attack.

Figure 4B:
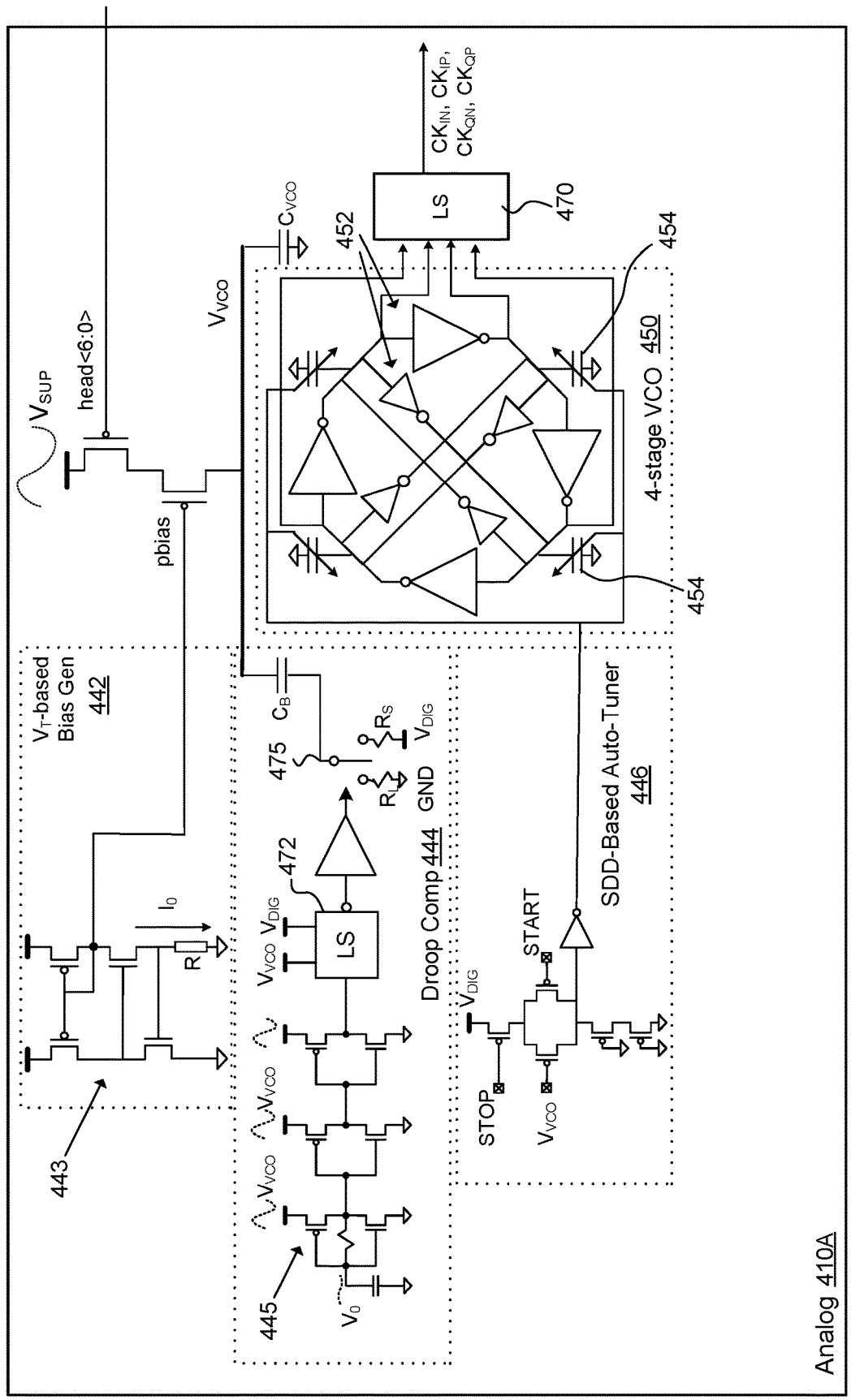
FIG. 4B and FIG. 4C are schematic block diagrams of example analog design portions of the clock glitch device of FIG. 4A, in accordance with various embodiments.
Figure 4C:
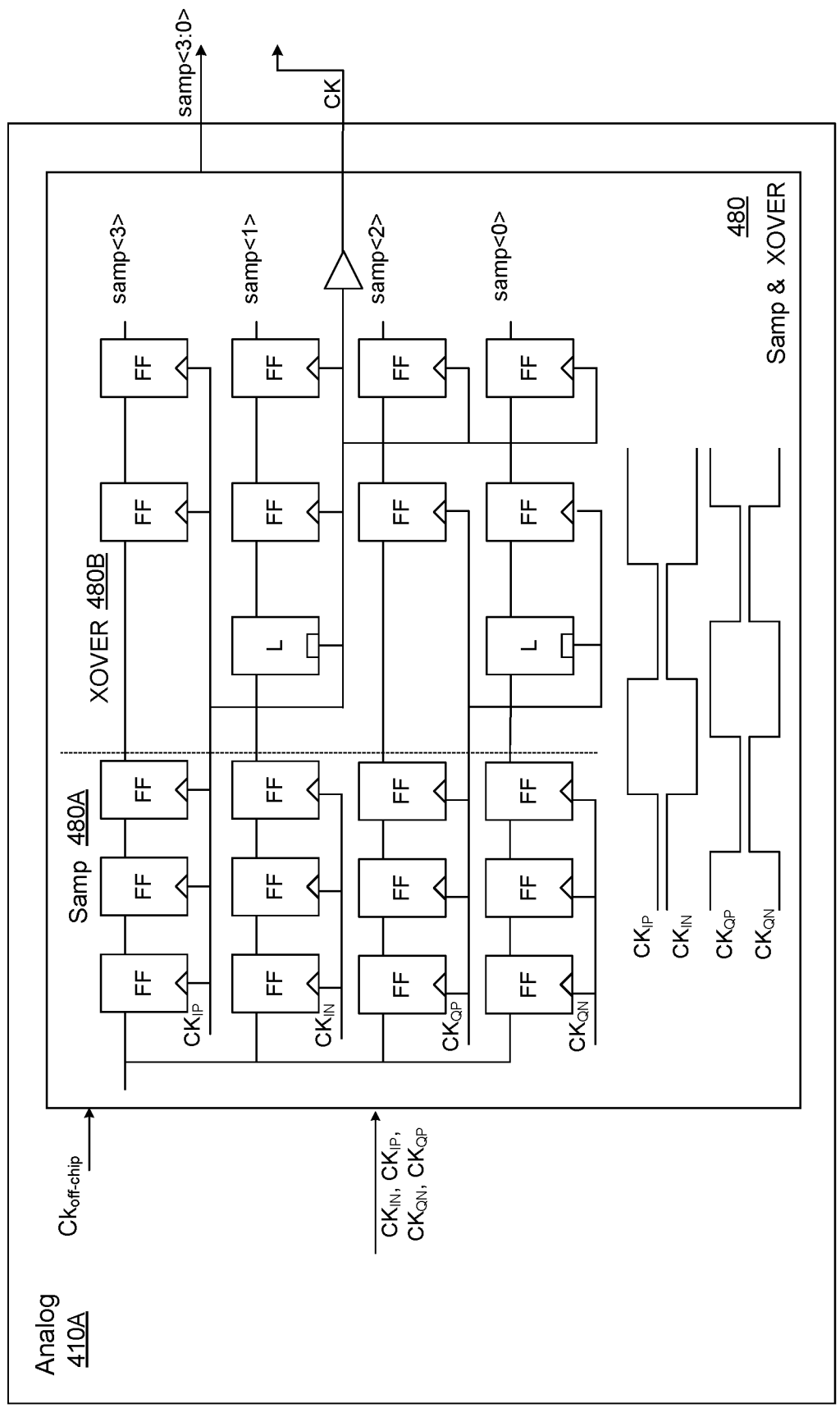

FIG. 4B and FIG. 4C are schematic block diagrams of example analog design portions of the clock glitch device 410 of FIG. 4A, in accordance with various embodiments. As discussed, FIG. 4B is a more detailed version of the analog frontend 410A, with a focus on the analog circuit techniques that are implemented to control the VCO speed spread across PVT corners and limit the false alarms. In at least some embodiments, the threshold voltage ($V_T$)-based bias generator 442 includes a current mirror 443 that generates an output voltage, to drive a second gate of the second transistor 464 based on a level of the digital supply voltage ($V_{DIG}$). In these embodiments, the $V_T$-based bias generator 442 may be based in n-type metal oxide semiconductor (NMOS) technology, and the current mirror 443 may include a pair of gate-coupled PMOS transistors coupled to a pair of gate-source (and gate-drain) coupled NMOS transistors. The current mirror 443 may generate a current ($I_O$) that is proportional to the threshold voltage of the bottom left NMOS transistor and inversely proportional to the resistor, R. In this way, the bias voltage to the second transistor 464 may follow the device threshold and stay relatively flat against VDD being greater than 0.5 V, helping to track the process and voltage variation.

In at least some embodiments, the droop compensation circuit 444 is coupled to the VCO capacitor ($C_{VCO}$) and increases the VCO supply voltage ($V_{VCO}$) in response to detecting a noise-based droop in the VCO supply voltage relative to the digital supply voltage ($V_{DIG}$). For example, when $V_{DIG}$ gets close to or lower than $V_{VCO}$ due to the droop, the droop compensation circuit 444 can supply additional voltage to the $V_{VCO}$ node. More specifically, the droop compensation circuit 444 may include a boosting capacitor ($C_B$) coupled in parallel with the VCO capacitor ($C_{VCO}$). The boosting capacitor may be much smaller than the VCO capacitor (e.g., between 1-10 pF). The droop compensation circuit 444 may further include a series of inverters 445 chained together and powered by the VCO supply voltage ($V_{VCO}$). The first inverter of the series of inverters 445 may include a feedback resistor and a shunt capacitor that receive an input voltage ($V_O$).

In these embodiments, the droop compensation circuit 444 further includes a level shifter 472 coupled to a final inverter of the series of inverters 445. The level shifter 472 may transfer noise from the final inverter to a logic level of the digital supply voltage ($V_{DIG}$). The droop compensation circuit 444 may further include a switch 475 selectively coupled between the boosting capacitor ($C_B$) and ground or between the boosting capacitor ($V_B$) and the digital supply voltage ($V_{DIG}$). In some embodiments, a large resistor ($R_L$) is positioned between ground and the switch 475 and a small resistor ($R_S$) (that is smaller than the large resistor) is positioned between the digital supply voltage ($V_{DIG}$) and the switch 475. The switch 475 may enable a path between the digital supply voltage and the boosting capacitor in response to the VCO supply voltage dropping to within a threshold difference value of the digital supply voltage. The small resistor ($R_S$) enables more of the $V_{DIG}$ to be stored to the boosting capacitor ($C_B$) to provide compensation to $V_{VCO}$ when the switch 475 is activated. In this way, the droop compensation circuit 444 helps maintain the VCO frequency against a low-frequency droop, as a mid-frequency to high-frequency droop may be filtered out through on-die capacitance of the boosting capacitor ($C_B$). The design of the droop compensation circuit 444 may be similarly employed to compensate for overshoot, e.g., in lieu of droop.

In at least some embodiments, the SDD-based auto-tuner 446 is coupled to the multiple banks of capacitors 454. In these embodiments, the SDD-based auto-tuner 446 detects that a difference between the digital supply voltage ($V_{DIG}$) (e.g., the chip supply voltage) and the VCO supply voltage ($V_{VCO}$) (e.g., oscillator supply voltage) drops below a threshold value, e.g., has become too small. In response to the detection, in at least some embodiments, the SDD-based auto-tuner 446 turns off one or more loading capacitors of identical capacitance from each of the multiple banks of loading capacitors 454 to fine-tune the multiple local clocks in response to process, voltage, temperature (PVT) variations. This fine-tuning may keep the multiple local clocks at the target frequency while keeping their multiple different phases evenly spread.

In various embodiments, the SDD-based auto-tuner 446 is implemented with mutually-coupled PMOS transistors, as illustrated, where at least one of the PMOS transistors is controllable to turn on (via the START signal) the SDD-based auto-tuner 446 and another of the PMOS transistors is controllable to turn off (via the STOP signal) the SDD-based auto-tuner 446. An inverter may be coupled to an output at sources of a middle two of the PMOS transistors from which the signal is generated to control the multiple banks of loading capacitors 454.

FIG. 4C, as was discussed, is a more-detailed example of the sample and crossover circuit 480 of the glitch detection device 410. In at least some embodiments, the sample and crossover circuit 480 includes a sampling circuit 480A, which was referred to previously as able to oversample, using the multiple local clocks generated by the VCO 450, the system clock ($CLK_{SYS}$) to generate the multiple samples of the system clock. The sampling circuit 480A may include a series of flip-flops (FF), for example, for each of the multiple local clocks ($CK_{IN}$, $CK_{IP}$, $CK_{QN}$, $CK_{QP}$). Example waveforms are illustrated for four local clocks, where $CK_{IP}$ and $CK_{IN}$ are mirror images of each other and $CK_{QP}$ and $CK_{QN}$ are mirror images of each other.

In at least some embodiments, the sample and crossover circuit 480 also includes a crossover circuit 480B. The crossover circuit 480B may include additional sets of flip-flops for each of the multiple local clocks, and a set of logic gates (L) that help merge the multiple local clocks to a single clock that is also provided to the multiple counters 412 of the glitch detector 420, for example (see FIG. 4A).

Figure 5:
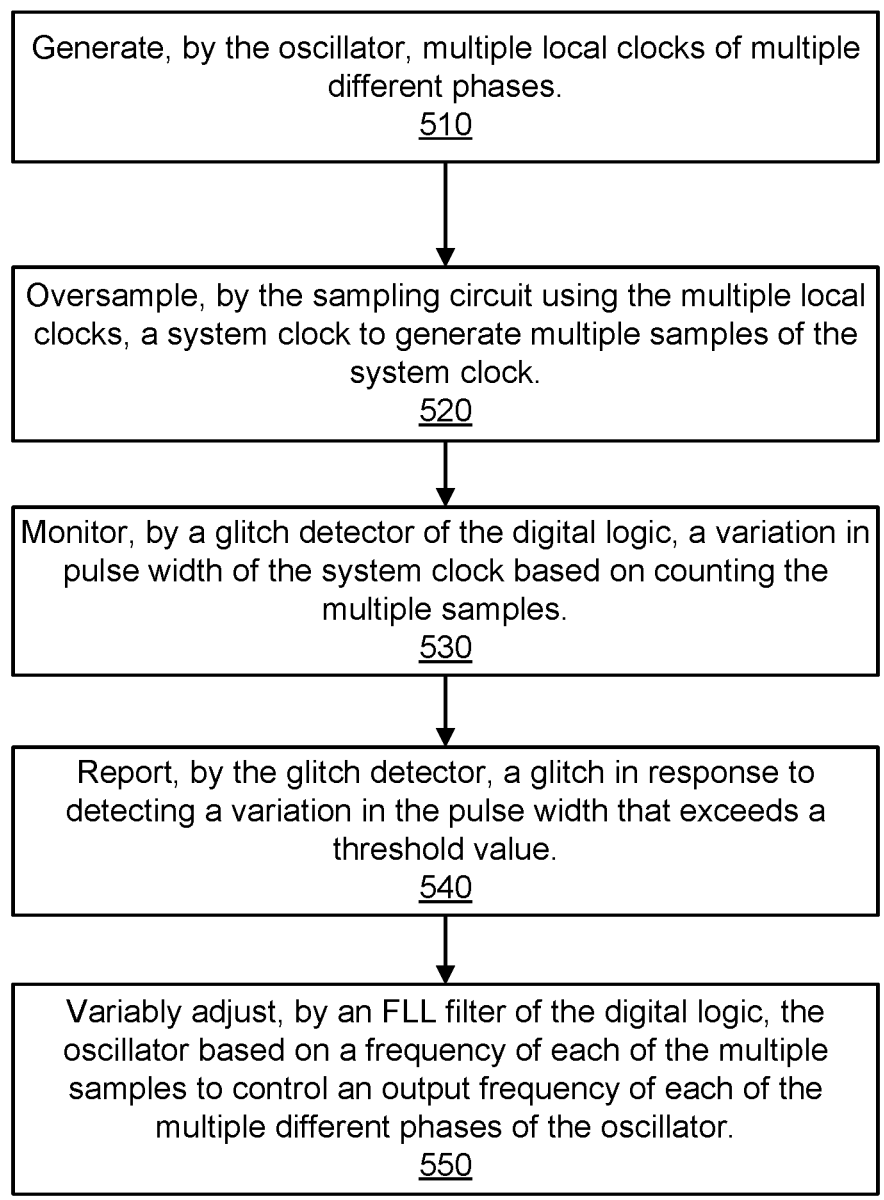
FIG. 5 is a flow diagram of a method of operating a glitch detection device, in accordance with at least some embodiments.

FIG. 5 is a flow diagram of a method 500 of operating a glitch detection device, in accordance with at least some embodiments. The method 500 may be performed by a combination of the analog and digital circuitry of the glitch detection device 110 or 410, as disclosed herein. Although shown in a particular sequence or order, unless otherwise specified, the order of the processes may be modified. Thus, the illustrated embodiments should be understood only as examples, and the illustrated processes may be performed in a different order, and some processes may be performed in parallel. Additionally, one or more processes may be omitted in various embodiments. Thus, not all processes are required in every embodiment. Other process flows are possible.

At operation 510, the oscillator 150 or 450 generates multiple local clocks of multiple different phases.

At operation 520, the sampling circuit 480A oversamples, using the multiple local clocks, a system clock to generate multiple samples of the system clock.

At operation 530, the glitch detector 420 (or digital logic) monitors a variation in pulse width of the system clock based on counting the multiple samples.

At operation 540, the glitch detector 420 (or digital logic) reports a glitch in response to detecting a variation in the pulse width that exceeds a threshold value.

At operation 550, the FLL filter circuit 430 (of the digital logic) variably adjusts the internal oscillator based on a frequency of each of the multiple samples to control an output frequency of each of the multiple different phases of the internal oscillator.

Other variations are within the scope of the present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: $\{A\}, \{B\}, \{C\}, \{A, B\}, \{A, C\}, \{B, C\}, \{A, B, C\}$. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, a "processor" may be a network device or a MACsec device. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a sub-system, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A glitch detection device comprising:
    an oscillator to generate multiple local clocks of multiple different phases;
    a sampling circuit to oversample, using the multiple local clocks, a system clock to generate multiple samples of the system clock; and
    a glitch detector coupled to the sampling circuit, the glitch detector to:
        monitor a variation in pulse width of the system clock based on counting the multiple samples; and
        report a glitch in response to detecting a variation in the pulse width that exceeds a threshold value.

2. The glitch detection device of claim 1, wherein the glitch detector comprises:
    multiple counters, one counter to count each of the multiple samples;
    a summer to combine values of the multiple counters and generate duty cycle measurements of pulses of the system clock; and
    glitch detector logic to detect the variation in pulse width based on the duty cycle measurements.

3. The glitch detection device of claim 2, further comprising:
    a level shifter coupled to the oscillator to translate the multiple local clocks to a logic level of the sampling circuit; and
    a crossover circuit coupled between the sampling circuit and the multiple counters, the crossover circuit to merge multiple phases of the multiple samples into a single-phase domain and provide a clock of the single-phase domain to the multiple counters.

4. The glitch detection device of claim 1, further comprising:
    a loop filter coupled between the glitch detector and the oscillator, the loop filter to variably adjust the oscillator based on a frequency of each of the multiple samples to control an output frequency of each of the multiple different phases of the oscillator, wherein the loop filter is configured to lock onto a frequency comprising a multiple of the system clock, and wherein the loop filter comprises:
        a subtractor to determine a difference between a measured pulse width of the system clock and a target multiple of a frequency of the system clock; and
        a first order digital filter coupled between the subtractor and the oscillator.

5. The glitch detection device of claim 4, further comprising a supply regulator to convert a chip supply voltage to an oscillator supply voltage, wherein the loop filter is to variably adjust the oscillator supply voltage based on a frequency of each of the multiple samples to control the output frequency of each of the multiple different phases.

6. The glitch detection device of claim 5, further comprising:
    multiple first transistors coupled to the chip supply voltage, wherein a gate of each of the multiple first transistors is coupled to an output of the loop filter;
    a second transistor coupled between the multiple first transistors and the oscillator supply voltage; and
    a threshold voltage ($V_T$)-based bias generator comprising a current mirror that generates an output voltage, to drive a second gate of the second transistor, based on a level of the chip supply voltage.

7. The glitch detection device of claim 5, wherein the oscillator comprises:
    an oscillator capacitor coupled to the supply regulator, the oscillator capacitor to hold the oscillator supply voltage;
    a multiple-stage ring oscillator; and
    multiple banks of loading capacitors, one coupled to each stage of the multiple-stage ring oscillator.

8. The glitch detection device of claim 7, further comprising a supply difference detector (SDD)-based auto-tuner coupled to the multiple banks of capacitors, the SDD-based auto-tuner to:
    detect that a difference between the chip supply voltage and the oscillator supply voltage drops below a threshold value; and
    in response to the detection, turn off one or more loading capacitors of identical capacitance from each of the multiple banks of loading capacitors to fine-tune the multiple local clocks in response to process, voltage, temperature (PVT) variations.

9. The glitch detection device of claim 7, further comprising a droop compensation circuit coupled to the oscillator capacitor, the droop compensation circuit to increase the oscillator supply voltage in response to detecting a noise-based droop in the oscillator supply voltage relative to the chip supply voltage.

10. The glitch detection device of claim 4, wherein the loop filter is a phase-locked loop (PLL) filter, further comprising:
a phase frequency detector (PFD) coupled between the oscillator and the system clock, the PFD to lock onto a phase of the system clock or output a digital error pulse; and
a charge pump coupled between the PFD and the PLL filter, the charge pump to convert the digital error pulse to an analog error current that is provided to the PLL filter.

11. The glitch detection device of claim 1, wherein the oscillator is one of a voltage-controlled oscillator (VCO), a supply-regulated ring oscillator, a current starving ring oscillator, a digitally-controlled ring oscillator, or an inductive-capacitive (LC) oscillator.

12. A computing system comprising:
an external oscillator that generates a system clock; and
a die coupled to the external oscillator, the die comprising:
an internal oscillator to generate multiple local clocks of multiple different phases;
a sampling circuit to oversample, using the multiple local clocks, the system clock to generate multiple samples of the system clock; and
a glitch detector coupled to the sampling circuit, the glitch detector to:
monitor a variation in pulse width of the system clock based on counting the multiple samples; and
report a glitch in response to detecting a variation in the pulse width exceeds a threshold value.

13. The computing system of claim 12, wherein the glitch detector comprises:
multiple counters, one counter to count each of the multiple samples;
a summer to combine values of the multiple counters and generate duty cycle measurements of pulses of the system clock; and
glitch detector logic to detect the variation in pulse width based on the duty cycle measurements.

14. The computing system of claim 13, wherein the die further comprises:
a level shifter coupled to the internal oscillator to translate the multiple local clocks to a logic level of the sampling circuit; and
a crossover circuit coupled between the sampling circuit and the multiple counters, the crossover circuit to merge multiple phases of the multiple samples into a single-phase domain and provide a clock of the single-phase domain to the multiple counters.

15. The computing system of claim 12, wherein the die further comprises:
a loop filter coupled between the glitch detector and the internal oscillator, the loop filter to variably adjust the internal oscillator based on a frequency of each of the multiple samples to control an output frequency of each of the multiple different phases of the internal oscillator, wherein the loop filter is configured to lock onto a frequency comprising a multiple of the system clock, and wherein the loop filter comprises:
a subtractor to determine a difference between a measured pulse width of the system clock and a target multiple of a frequency of the system clock; and
a first order digital filter coupled between the subtractor and the internal oscillator.

16. The computing system of claim 15, wherein the die further comprises a supply regulator to convert a chip supply voltage to an oscillator supply voltage, wherein the loop filter is to variably adjust the oscillator supply voltage based on a frequency of each of the multiple samples to control the output frequency of each of the multiple different phases.

17. The computing system of claim 16, wherein the die further comprises:
multiple first transistors coupled to the chip supply voltage, wherein a gate of each of the multiple first transistors is coupled to an output of the loop filter;
a second transistor coupled between the multiple first transistors and the oscillator supply voltage; and
a threshold voltage ($V_T$)-based bias generator comprising a current mirror that generates an output voltage, to drive a second gate of the second transistor, based on a level of the chip supply voltage.

18. The computing system of claim 16, wherein the internal oscillator comprises:
an oscillator capacitor coupled to the supply regulator, the oscillator capacitor to hold the oscillator supply voltage;
a multiple-stage ring oscillator; and
multiple banks of loading capacitors, one coupled to each stage of the multiple-stage ring oscillator.

19. The computing system of claim 18, wherein the die further comprises a supply difference detector (SDD)-based auto-tuner coupled to the multiple banks of capacitors, the SDD-based auto-tuner to:
detect that a difference between the chip supply voltage and the oscillator supply voltage drops below a threshold value; and
in response to the detection, turn off one or more loading capacitors of identical capacitance from each of the multiple banks of loading capacitors to fine-tune the multiple local clocks in response to process, voltage, temperature (PVT) variations.

20. The computing system of claim 19, wherein the die further comprises a droop compensation circuit coupled to the oscillator capacitor, the droop compensation circuit to increase the oscillator supply voltage in response to detecting a noise-based droop in the oscillator supply voltage relative to the chip supply voltage.

21. The computing system of claim 15, wherein the loop filter is a phase-locked loop (PLL) filter, wherein the die further comprises:
a phase frequency detector (PFD) coupled between the oscillator and the system clock, the PFD to lock onto a phase of the system clock or output a digital error pulse; and
a charge pump coupled between the PFD and the PLL filter, the charge pump to convert the digital error pulse to an analog error current that is provided to the PLL filter.

22. The computing system of claim 12, wherein the internal oscillator is one of a voltage-controlled oscillator (VCO), a supply-regulated ring oscillator, a current starving ring oscillator, a digitally-controlled ring oscillator, or an inductive-capacitive (LC) oscillator.

23. A method of operating a glitch detection circuit comprising an oscillator, a sampling circuit, and digital logic for controlling the oscillator, the method of operating the glitch detection circuit comprising a plurality of operations comprising:
generating, by the oscillator, multiple local clocks of multiple different phases;

oversampling, by the sampling circuit using the multiple local clocks, a system clock to generate multiple samples of the system clock;
monitoring, by a glitch detector of the digital logic, a variation in pulse width of the system clock based on counting the multiple samples; and
reporting, by the glitch detector, a glitch in response to detecting a variation in the pulse width that exceeds a threshold value.

* * * * *